(12) United States Patent
Chen (10) Patent No.: US 7,742,343 B2
(45) Date of Patent: Jun. 22, 2010

(54) METAL OXIDE SEMICONDUCTOR DEVICE AND METHOD FOR OPERATING AN ARRAY STRUCTURE COMPRISING THE SAME DEVICES

(76) Inventor: Chia-Hsing Chen, No.92, Alley 122, Lane 648, Minghu Rd., Hsinchu City 300 (TW)

(*) Notice: Subject to any disclaimer, the term of this patent is extended or adjusted under 35 U.S.C. 154(b) by 90 days.

(21) Appl. No.: 11/755,059

(22) Filed: May 30, 2007

(65) Prior Publication Data
US 2008/0298135 A1 Dec. 4, 2008

(51) Int. Cl.
*G11C 16/04* (2006.01)
(52) U.S. Cl. .......................... 365/185.28; 365/185.01; 365/185.18
(58) Field of Classification Search .......... 365/185.28, 365/185.01, 185.18

See application file for complete search history.

(56) References Cited

U.S. PATENT DOCUMENTS 4,193,182 A * 3/1980 Lee ........................... 438/181

* cited by examiner

*Primary Examiner*—Huan Hoang
(74) *Attorney, Agent, or Firm*—Ming Chow Sinorica, LLC (57) ABSTRACT

The present invention discloses a metal oxide semiconductor (MOS) device and a method for operating an array structure comprising the same devices. The MOS device of the present invention comprises a device layer; an ion-implanted layer formed on the device layer and providing the source, the drain and the channel; and a gate structure formed on the ion-implanted layer. Via applying a bias voltage to the gate, the carrier density in the channel region is different from that in the source region or the drain region; thereby, the MOS device of the present invention can undertake programming, erasing and reading activities. The present invention can simplify the MOS device fabrication process, reduce the operating voltage, and promote the integration density of a 2-dimensional or 3-dimensional MOS device array.

34 Claims, 9 Drawing Sheets

METAL OXIDE SEMICONDUCTOR DEVICE AND METHOD FOR OPERATING AN ARRAY STRUCTURE COMPRISING THE SAME DEVICES

BACKGROUND OF THE INVENTION

1. Field of the Invention

The present invention relates to a semiconductor device, particularly to a MOS (Metal Oxide Semiconductor) device and a method for operating an array structure comprising the same devices.

2. Description of the Related Art

The prosperous development of communication and network is attributed to the fast advancing IC technology. The advance of IC technology is motivated by the persistent dimensional reduction, which decreases power consumption, increases switching speed, promotes integration density, and upgrades performance (such as the performance of data storage, logic operation, and signal processing). For a logic device, high operation speed relies on a sufficient saturation drain current and a low gate capacitance, and low power consumption relies on a further lower leakage current.

Figure 1:
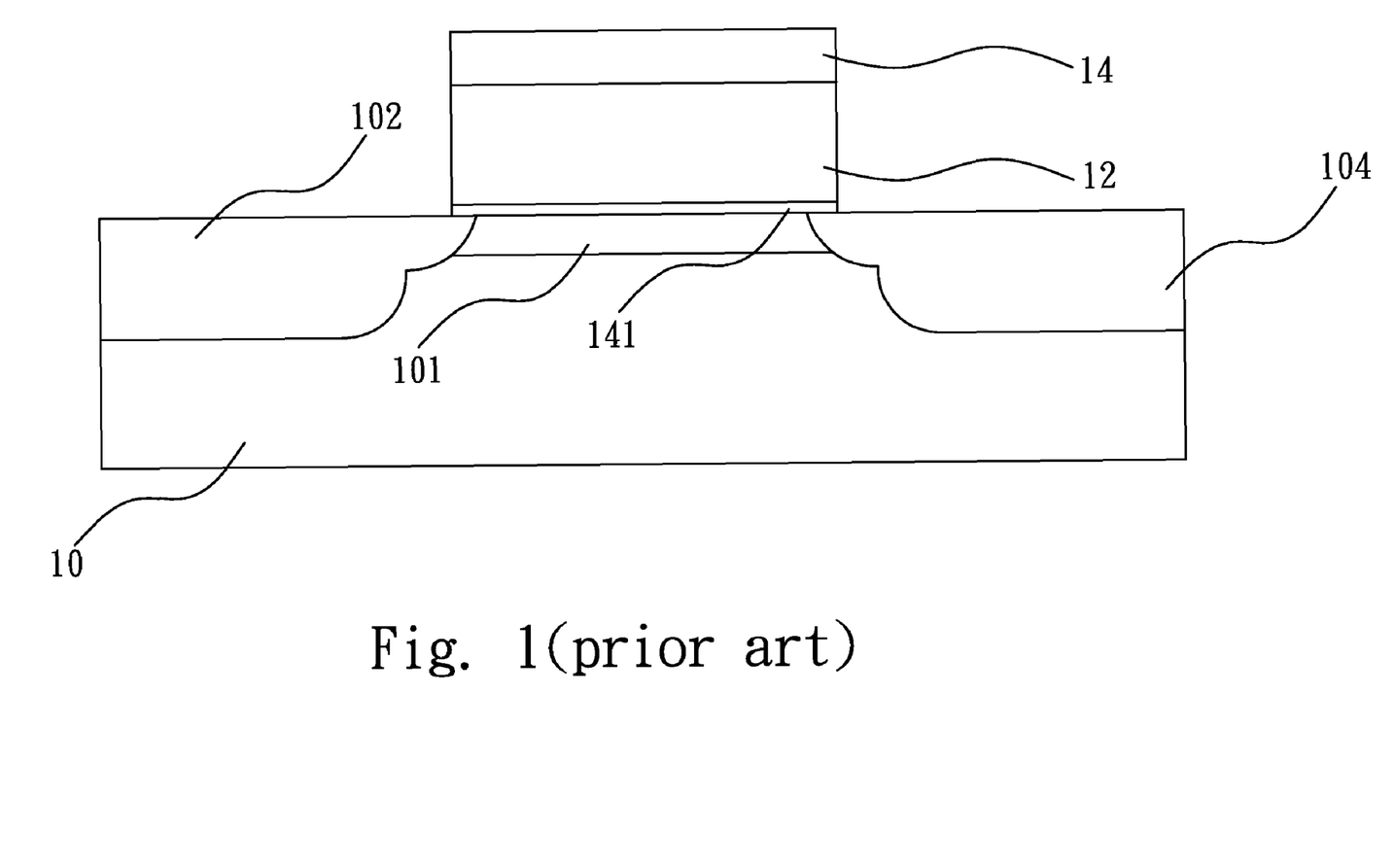
FIG. 1 is a sectional view schematically showing a conventional MOS device.

For a MOS (Metal Oxide Semiconductor) device, the size thereof is 3-dimensionally reduced. As shown in FIG. 1, a conventional MOS device comprises a substrate 10 having a source 102, a drain 104 and a channel 101 thereinside, a gate dielectric layer 12 formed over the substrate 10 and a gate layer 14 formed over the gate dielectric layer 12. For a MOS device, all structural factors influence the performance. Therefore, in addition to the length, width and height of the entire structure, the thickness of the gate dielectric layer 12, the junction depths of the source 102 and the drain 104, etc., also influence the performance of the MOS device. Via reducing the length and width of a MOS device, the integration density is promoted. Besides, decreasing the length of the channel 101 can increases the efficiency of driving power because the required driving current is inversely proportional to the length of the channel 101. The bottleneck of the MOS device fabrication process is primarily in photolithography. As the electric characteristics required by the source 102 and the drain 104 is different from that required by the channel 101, the conventional MOS device fabrication process is pretty complicated. The diffusion problem between the channel 101 and the source 102/drain 104 usually degrades the miniaturization capability. Due to the electric characteristics of the channel 101, the source 102 and the drain 104, a conventional MOS device has an inversion layer 141, which is below the gate and implements the reading activities of the device. However, an induced current, which inactivates the electric characteristics of the MOS device, is created when carriers drift across the inversion layer 141. The short-channel effect and the narrow-channel effect on a MOS device also need to be overcome. Modifying the sectional structural factors, such as decreasing the junction depth and the thickness of the gate dielectric layer 12, increasing the concentration of the implanted ions of the substrate 10, etc., is usually used to reduce the influence of the short-channel effect.

In the conventional technology, the abovementioned decreasing the junction depth and increasing the implanted-ion concentration of the substrate are realized via the means of ion implantation. To reach the specified depth, the ions should be accelerated to a sufficient speed. The concentration of the implanted ion can be precisely controlled via process parameters.

In the current MOS devices, different ions with different concentrations are respectively implanted into different regions of the substrate to prevent from the problems caused by the miniaturization of a MOS device. However, device miniaturization also makes the ion-implanted regions and the spacing between the ion-implanted regions become smaller. Thus, the structure of the overall MOS device becomes more complicated, which results in a higher process complexity and a lower device precision.

Figure 2:
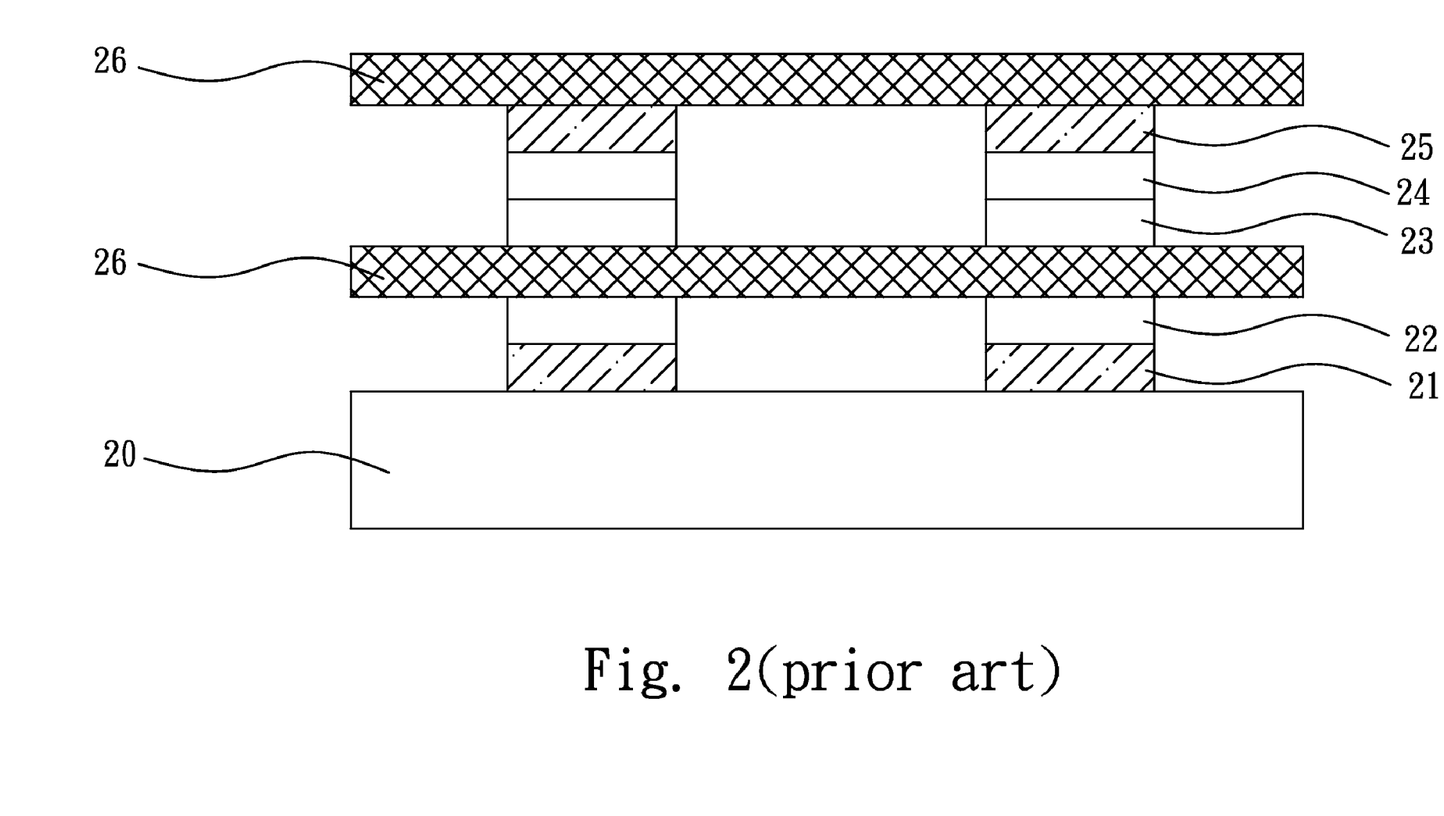
FIG. 2 is a sectional view schematically showing another conventional MOS device.

Refer to FIG. 2. A U.S. Pat. No. 6,704,253 disclosed a memory device, wherein a plurality of layers is formed over the substrate 20. The layers between two conduction layers 21 and 25 form a memory unit, including a semiconductor layer 22, a dielectric storage layer 26, a lightly-doped layer 23 and a heavily-doped layer 24. However, in addition to the complicated multi-layer structure, the layers must be further separately etched to obtain specified patterns. Therefore, the conventional memory device has a very complicated fabrication process and needs higher material and fabrication costs.

Accordingly, the present invention proposes a metal oxide semiconductor device and a method for operating the same to solve the abovementioned problems.

SUMMARY OF THE INVENTION

The primary objective of the present invention is to provide a MOS (Metal Oxide Semiconductor) device and a method for operating an array structure comprising the same devices, wherein a single ion-implanted layer replaces the conventional source-drain structure, and thus less power is required when the MOS device is undertaking programming or erasing activities.

Another objective of the present invention is to provide a MOS device and a method for operating an array structure comprising the same devices, wherein the simpler MOS structure greatly benefits the 2-dimensional or 3-dimensional miniaturization of the MOS device.

To achieve the abovementioned objectives, the present invention proposes a MOS device structure, which comprises a device layer; at least one ion-implanted layer formed on at least one surface of the device layer; and at least one gate structure formed on the ion-implanted layer. The gate structure further comprises a dielectric layer and a gate layer. The device layer may be made of a semiconductor material, an insulating material or a composite material and may be in the form of a bottom substrate or an interjacent layer. The ion-implanted layer has only one type of implanted ion and can simultaneously perform the functions of the source, the drain and the channel. The dielectric layer has a sandwich structure of insulating layer/storage layer/insulating layer, usually silicon oxide/silicon nitride/silicon oxide. The gate layer may be made of a metal or polysilicon.

The present invention also proposes a MOS device array structure, which comprises a plurality of gate structures formed on a device layer having an ion-implanted layer. The gate structures are used to form a plurality of word lines, and a plurality of bit lines is formed over the gate structures and crosses the word lines. The mutually crossing word lines and bit lines are used to construct a MOS device array structure. In the MOS device structure of the present invention, two ion-implanted layers may be respectively formed on two surfaces of the device layer; therefore, the array structure of the present invention can achieve a pretty high integration density no matter whether in a 2-dimensional or 3-dimensional integration.

The present invention also proposes a method for operating the abovementioned MOS device array structure comprising a plurality of word lines and a plurality of bit lines. In the MOS device array structure, each bit line is coupled to a plurality of MOS devices via bit line contact windows and then coupled to a source line. Each word line is coupled to the gate structures of a plurality of MOS devices. The word lines control the switching of MOS devices, and the bit lines transmit data to the assigned MOS devices. Further, the MOS devices on different device layers are interconnected to form a 3-dimensional array structure via the coupling between the plurality of word lines and the plurality of bit line contact windows. In the method for operating the MOS device array structure of the present invention, firstly, a word line and a bit line are used to determine a MOS device; next, the word line and the bit line transmit bias voltages to the determined MOS device; then, the MOS device changes the state of the charges in the storage layer thereinside to complete a programming, reading or erasing activity.

Below, the embodiments are described in detail in cooperation with the attached drawings to make easily understood the objectives, the technical contents and accomplishments of the present invention.

DETAILED DESCRIPTION OF THE INVENTION

The present invention proposes a MOS device structure to provide a simpler-structure and higher-miniaturization MOS device. Further, the present invention also proposes a method for operating an array structure comprising the same devices. Below, the embodiments will be disclosed in detail in cooperation with the drawings to exemplify the present invention.

Figure 3:
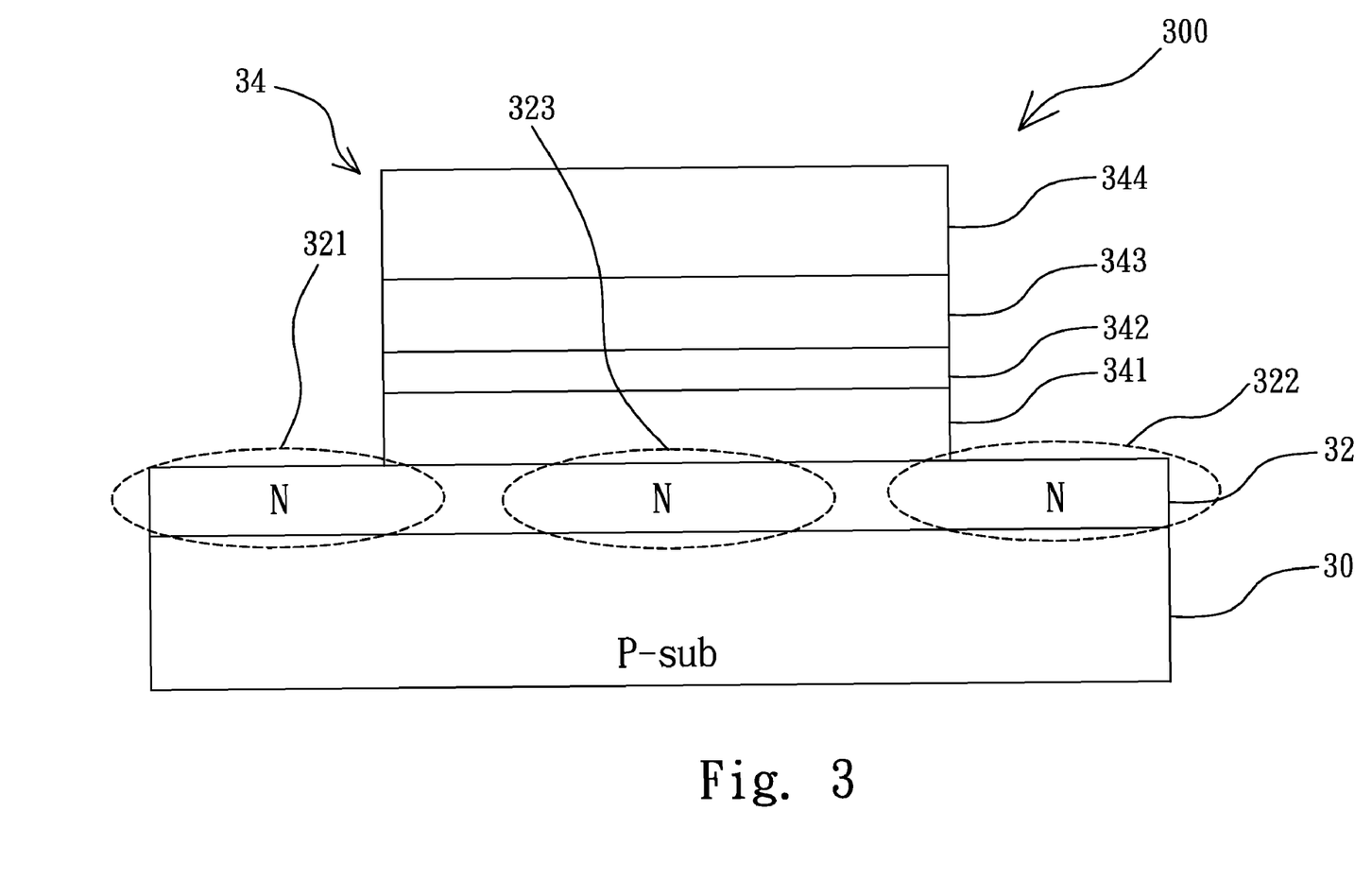
FIG. 3 is a sectional view schematically showing a first MOS device according to the present invention.

In the embodiments described below, the device layers are all exemplified by a substrate made of a semiconductor material. However, in the present invention, the device layer is not limited to a semiconductor substrate but may also be made of an insulating material or a composite material. For example, the device layer may be an oxide substrate or a shallowly-implanted and heavily-doped double-well substrate. The device may be in the form of a substrate or an interjacent layer. The semiconductor substrate in the following embodiment is only to exemplify the device layer but not to limit the form of the device layer. Refer to FIG. 3 a sectional view schematically showing a first MOS device according to the present invention. As shown in FIG. 3, an N-type ion-implanted layer 32 is formed on a P-type semiconductor substrate 30. The ion-implanted layer 32 has only one type of implanted ion, and the related parameters, such as the concentration, distribution, etc., of the ion, can be modified according to requirements. However, the ion-implanted layer 32 provides an N-type source region 321, an N-type drain region 322 and an N-type channel region 323 between the N-type source region 321 and the N-type drain region 322. A gate structure 34 is formed over the N-type channel region 323, and the gate structure 34 further comprises a dielectric layer and a gate layer 344. The dielectric layer has a structure of insulating layer 341/storage layer 342/insulating layer 343. The N-type source region 321, N-type drain region 322 and N-type channel region 323 of the N-type ion-implanted layer 32 all have the same implanted ion and the same ion concentration. Then, none depletion layer, which results from the junction between different ion-implanted regions, exists in the path of carrier transportation. Thus, the energy barrier of carrier movement is greatly reduced when carriers move in the N-type ion-implanted layer 32. Therefore, the bias voltage required by the MOS device 300 is effectively decreased, and the speed of carrier movement increases.

Figure 4:
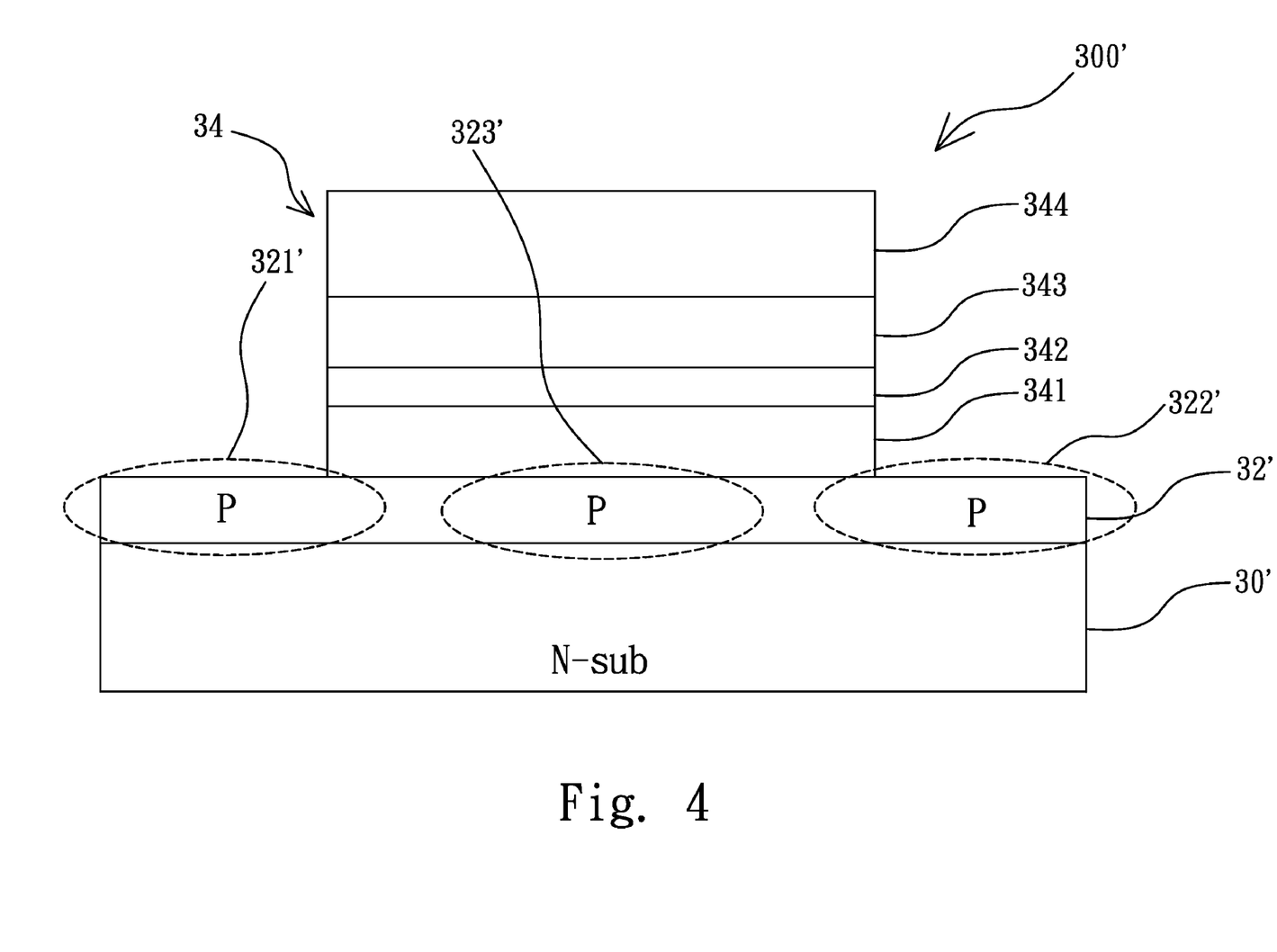
FIG. 4 is a sectional view schematically showing a second MOS device according to the present invention.

Refer to FIG. 4 a sectional view schematically showing a second MOS device according to the present invention. Different from the MOS device shown in FIG. 3, the MOS device 300' of this embodiment has an N-type semiconductor substrate 30' and a P-type ion-implanted layer 32' formed on the N-type semiconductor substrate 30'. The P-type ion-implanted layer 32' has a P-type source region 321', a P-type drain region 322' and a P-type channel region 323'. Similarly, a gate structure 34 is formed over the P-type channel region 323', and the gate structure 34 further comprises a dielectric layer and a gate layer 344, and the dielectric layer has a structure of insulating layer 341/storage layer 342/insulating layer 343. No matter whether in the MOS device shown in FIG. 3 or FIG. 4, the gate structure is a floating gate or a charge-trapping gate, and the details thereof will not be described herein.

Figure 5:
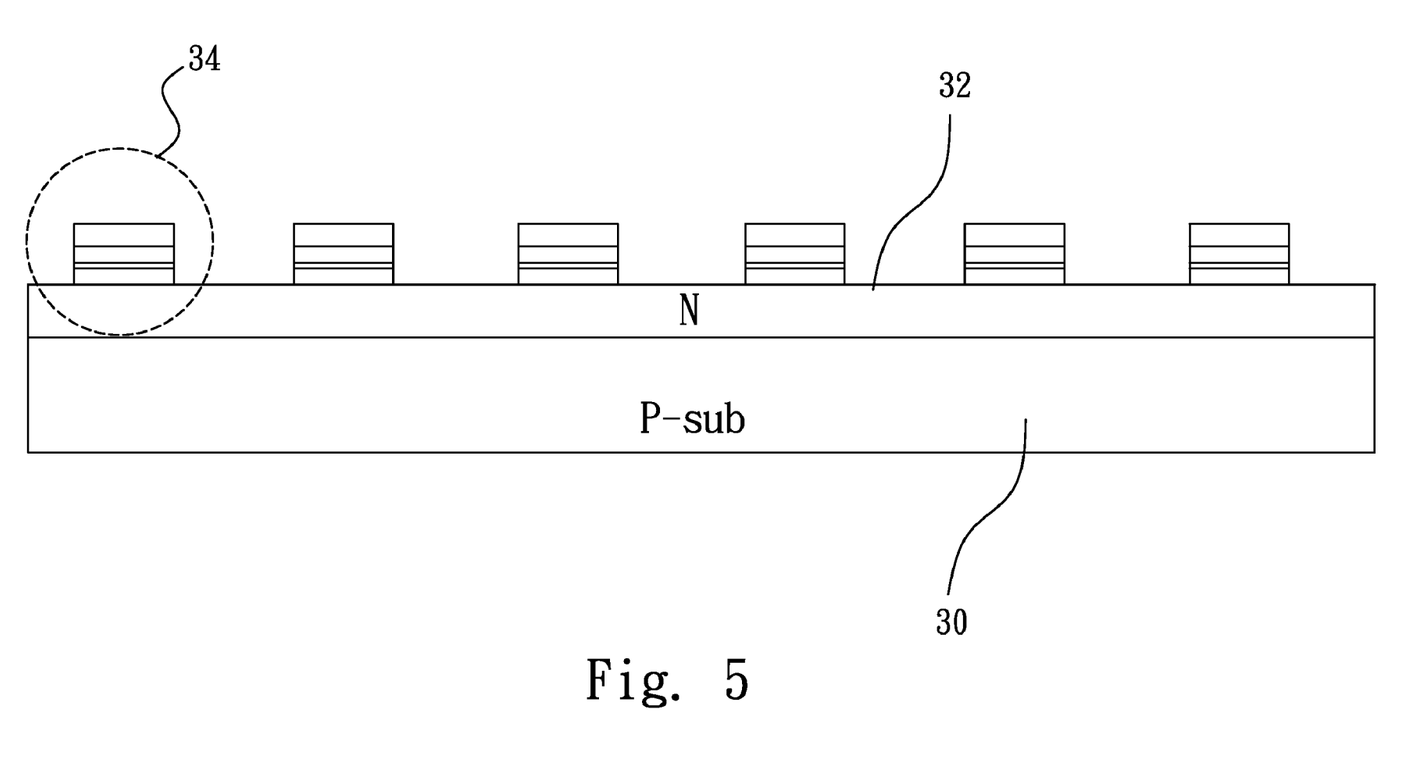
FIG. 5 is a diagram schematically showing a first embodiment of the MOS device array according to the present invention.
Figure 6:
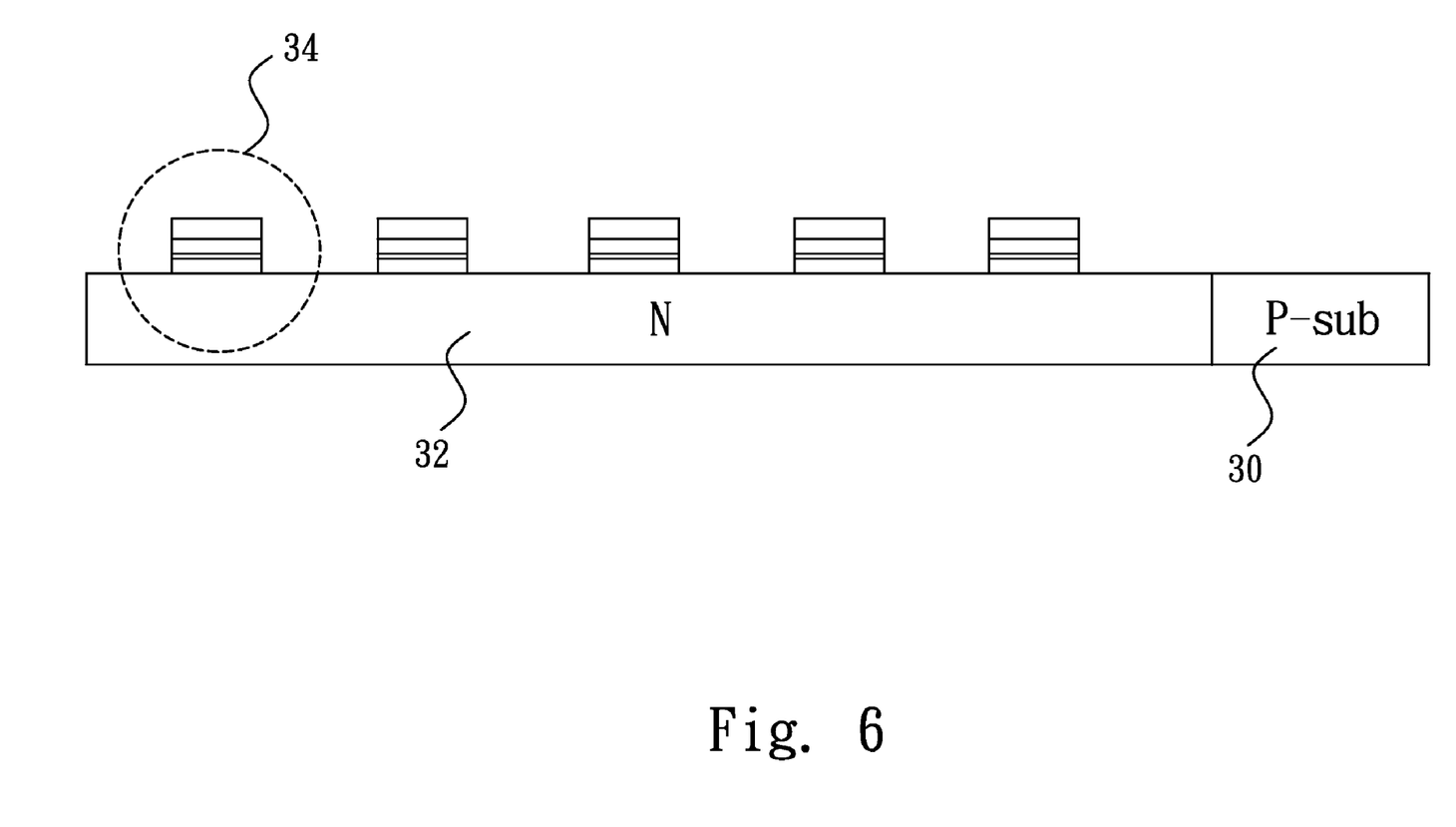
FIG. 6 is a diagram schematically showing a second embodiment of the MOS device array according to the present invention.
Figure 7:
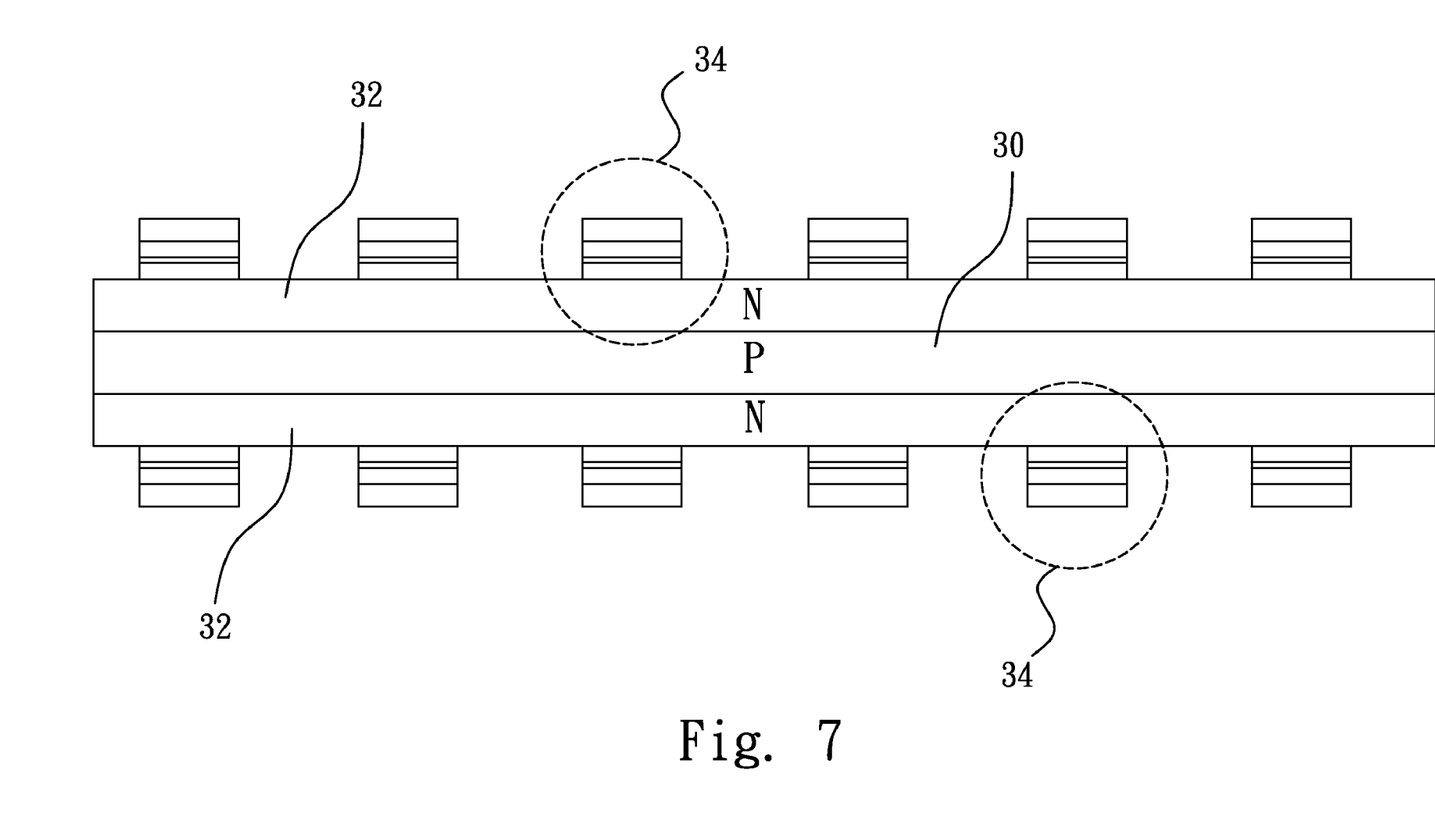
FIG. 7 is a diagram schematically showing a third embodiment of the MOS device array according to the present invention.

The fabrication of the MOS device of the present invention is free of complicated ion-implantation processes because of its simpler structure. As to the 2-dimensional miniaturization capability of the present invention, refer to FIG. 5 a diagram schematically showing a first embodiment of the MOS device array of the present invention. As shown in FIG. 5, a plurality of MOS devices can be 2-dimensionally coupled to form a MOS device array merely via forming an N-type ion-implanted layer 32 on a P-type semiconductor substrate 30 and forming a plurality of gate structures 34 on appropriate positions. Refer to FIG. 6 a diagram schematically showing a second embodiment of the MOS device array of the present invention. In this embodiment, the N-type ion-implanted layer 32 extends from the end of the P-type semiconductor substrate 30, and a plurality of gate structures 34 is formed on the N-type ion-implanted layer 32. Refer to FIG. 5 and FIG. 7, wherein FIG. 7 is a diagram schematically showing a third embodiment of the MOS device array of the present invention. The third embodiment shown in FIG. 7 is an extension of the first embodiment shown in FIG. 5 and characterized in that a first N-type ion-implanted layer 32 and a second N-type ion-implanted layer 32 are respectively formed on a first surface and a second surface of the P-type semiconductor substrate 30. Thus, in this embodiment, the P-type semiconductor substrate 30 is interposed between the first N-type ion-implanted layer 32 and the second N-type ion-implanted layer 32. Then, a plurality of first gate structures 34 and a plurality of second gate structures 34 are respectively formed on the appropriate positions of the first N-type ion-implanted layer 32 and the second N-type ion-implanted layer 32 to form a 3-dimensional MOS device array.

The abovementioned embodiments adopt a P-type semiconductor substrate, a P-type semiconductor layer and an N-type ion-implanted layer to exemplify the present invention. However, an N-type semiconductor substrate, an N-type semiconductor layer and a P-type ion-implanted layer can also apply to the abovementioned structure. Further, the semiconductor substrate of the abovementioned MOS device can be replaced by any one of an insulating substrate, an insulating layer, a composite substrate and a composite layer, which are to be also included within the scope of the present invention.

Figure 8:
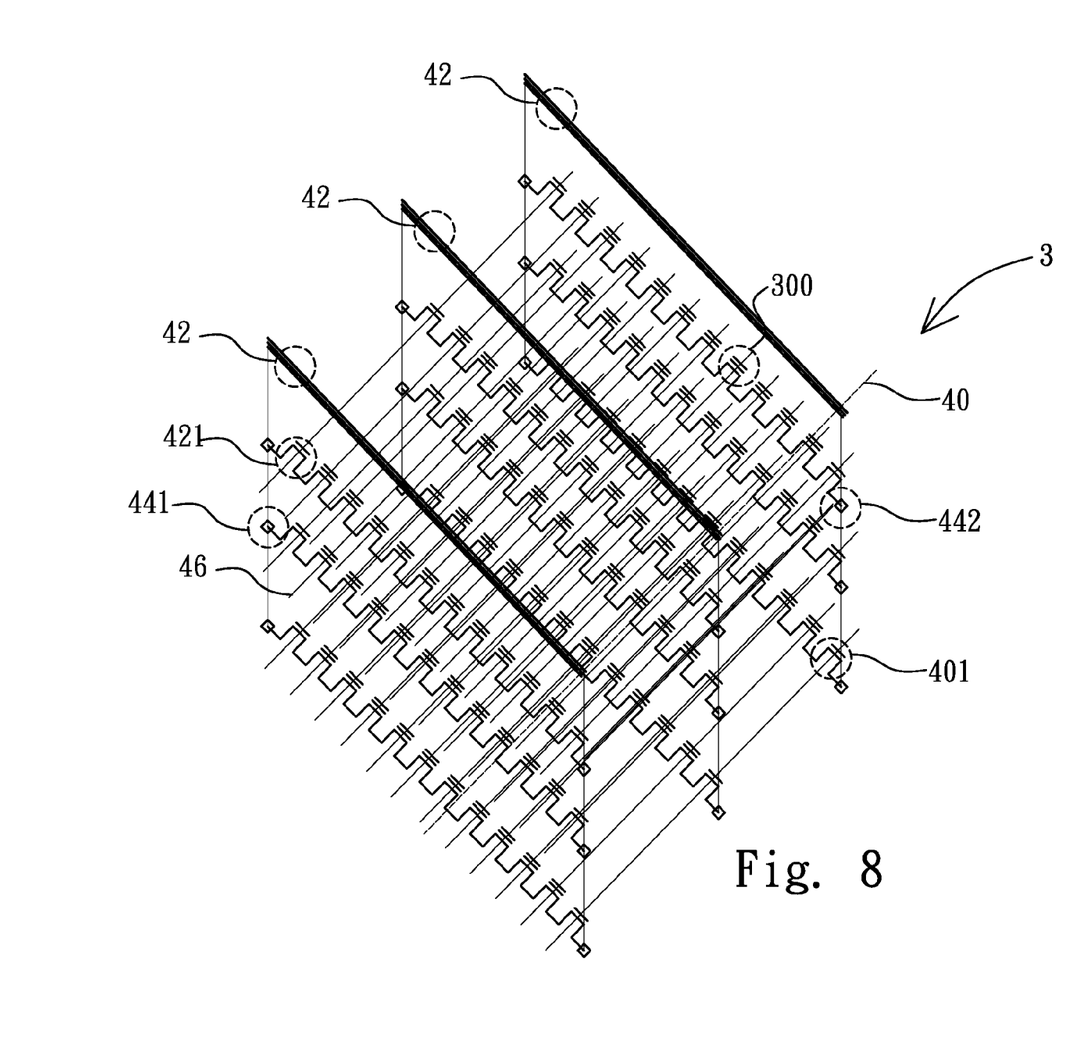
FIG. 8 is a diagram schematically showing a 3-dimensional MOS device array according to the present invention.
Figure 9:
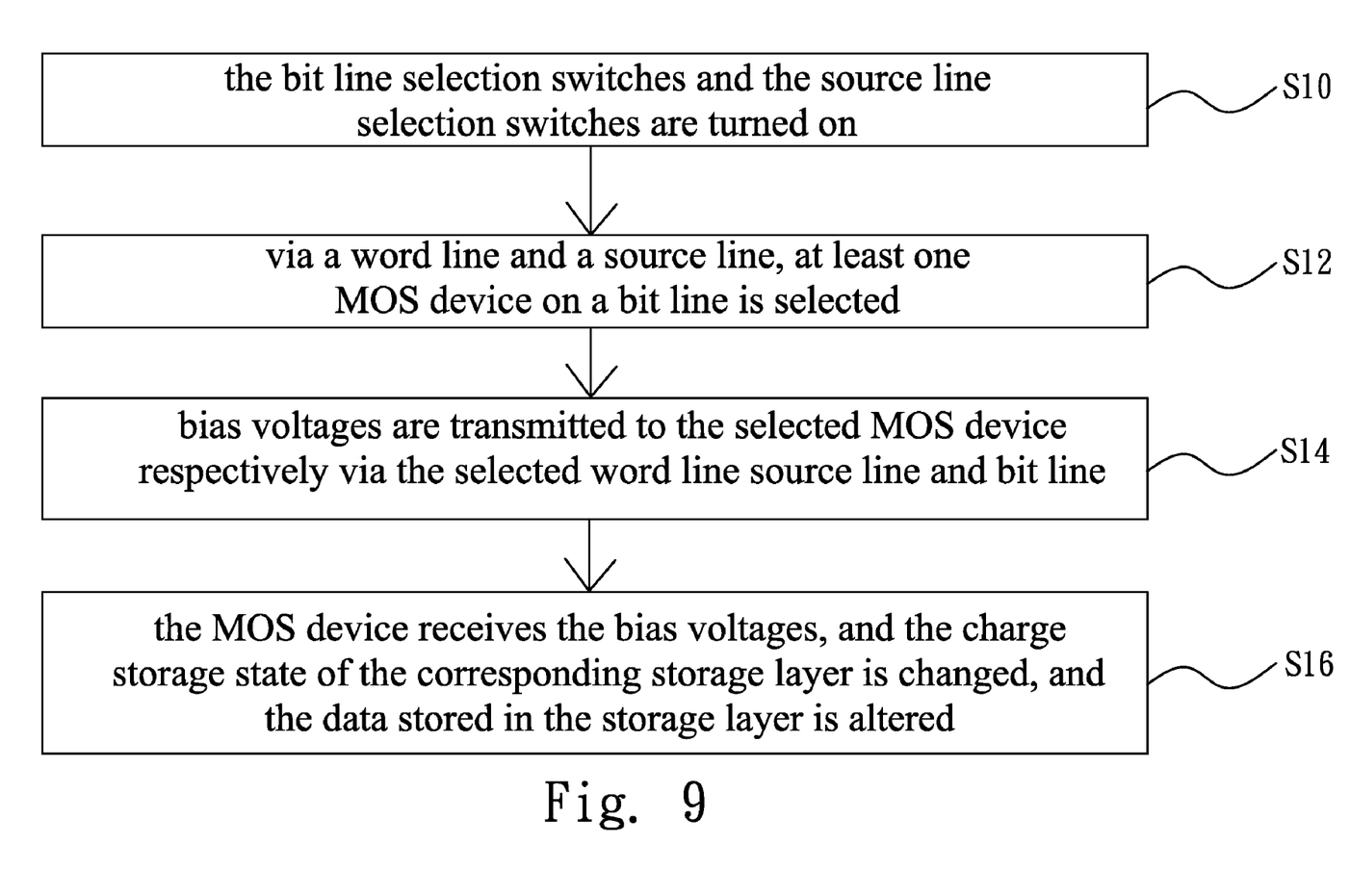
FIG. 9 is a flowchart of the method for operating MOS device array according to the present invention.

Refer to FIG. 8 a diagram schematically showing a 3-dimensional MOS device array according to the present invention. As shown in FIG. 8, the MOS device array 3 comprises a plurality of bit lines 42, a plurality of bit line contact windows 441, a plurality of bit line selection switches 421, a plurality of source line selection switches 401, a plurality of source line contact windows 442, a plurality of source lines 40 (the source line 40 is denoted by a dotted line because the source line 40 is below the bit line 42), and a plurality of word lines 46. The word lines 46 are only formed in 2-dimensional directions. The source line contact windows 442 are coupled to each other in 3-dimensional directions. The source line contact windows 442 are coupled to the source line selection switches 401 on the same device layer. The source lines 40 are coupled to the source line selection switches 401 on different device layers via the source line contact windows 442; then, the source lines 40 are further coupled to the MOS devices 300 on different device layers via the source line selection switches 401. The bit line contact windows 441 are coupled to each other in 3-dimensional directions. The bit line contact windows 441 are coupled to the bit line selection switches 421 on the same device layer. The bit line selection switches 421 are coupled to all the MOS devices 300 on the same device layer. The bit line contact windows 441 are coupled to the bit lines 42 on the topmost device layer. The word lines 46 are formed by that a plurality of MOS devices 300 are coupled to each other via the gate structures thereof. The MOS device 300 herein may be one of the MOS devices disclosed in the embodiments mentioned above, and the descriptions thereof will not repeated herein. Refer to FIG. 9 a flowchart showing the method for operating the MOS device array 3, wherein the structure of the MOS device thereof has been shown in FIG. 3. In Step S10, the bit line selection switches 421, which are coupled to MOS devices 300 and the corresponding bit lines 42, are turned on; the source line selection switches 401, which are coupled to the source lines 40 corresponding to the bit lines 42, are also turned on. In Step S12, via a word line 46 and a source line 40, at least one MOS device 300 on a bit line 42 is selected. In Step S14, bias voltages are transmitted to the selected MOS device 300 respectively via the selected word line 46, source line 40 and bit line 42. In Step S16, the MOS device 300 receives the bias voltages, and the charge storage state of the corresponding storage layer 342 is changed, and the data stored in the storage layer 342 is thus altered.

In the abovementioned method, different bias voltages are used to determine the memory behavior of the storage layer inside the MOS device. For example, when the MOS device is programmed, the input bias voltage makes electrons/holes move from the channel region of the ion-implanted layer to the storage layer, and the state of the corresponding bit line shifts from 1/0 to 0/1. The mechanism of electron/hole movement depends on the type of the device layer. When the device layer is made of a P-type semiconductor material, the mechanisms of electron/hole movement include the FN (Fowler Nordheim) tunneling method from the gate structure or the channel region, SHH (Substrate Hot Hole) injection method, and BTBHE (Band-To-Band Hot Electron) injection method. When the device layer is made of an N-type semiconductor material, the mechanisms of electron/hole movement include the FN (Fowler Nordheim) tunneling method from the gate structure or the channel region, SHE (Substrate Hot Electron) injection method, and BTBHH (Band-To-Band Hot Hole) injection method. When the MOS device undertakes an erasing activity, the input bias voltage makes the electrons/holes move from the storage layer through the channel region of the ion-implanted layer to the exterior of the MOS device, and the state of the corresponding bit line shifts from 0 to 1. Similarly, the mechanism of electron/hole movement also depends on the type of the device layer. When the device layer is made of a P-type semiconductor material, the mechanisms of electron/hole movement include the FN (Fowler Nordheim) tunneling method from the gate structure or the channel region, SHH (Substrate Hot Hole) injection method, and BTBHE (Band-To-Band Hot Electron) injection method. When the device layer is made of an N-type semiconductor material, the mechanisms of electron/hole movement include the FN (Fowler Nordheim) tunneling method from the gate stricture or the channel region, SHE (Substrate Hot Electron) injection method, and BTBHH (Band-To-Band Hot Hole) injection method. When the MOS device undertakes a reading activity, the read current is an electron current if N-type ions are implanted into the ion-implanted layer, and the read current is a hole current if P-type ions are implanted into the ion-implanted layer.

To guarantee that the change of the memory state of the MOS device is fully completed, a confirming process is added to make sure whether each electron/hole transmission process is fully completed after bias voltages have been fully input to the MOS device.

Summarily, in the present invention, carriers move in a simplified MOS device structure, wherein the electric characteristics of the source region, the drain region and the channel region are identical, and none inversion layer exist therebetween. Therefore, no energy is consumed in any inversion layer. Further, the energy barrier of carrier movement is decreased. Thereby, not only the efficiency of operating a MOS device is effectively promoted, but also the energy consumed in the programming, erasing or reading activity of a MOS device is reduced.

Those described above are the embodiments to exemplify the present invention to enable the persons skilled in the art to understand, make and use the present invention. However, it is not intended to limit the scope of the present invention. Any equivalent modification or variation according to the spirit of the present invention is to be also included within the scope of the present invention.

What is claimed is:

1. A metal oxide semiconductor device array structure comprising:
   a plurality of metal oxide semiconductor devices coupled to each other and each of said metal oxide semiconductor devices comprises:
   a device layer having a first surface and a second surface;
   a first ion-implanted layer formed on said first surface of said device layer and providing at least one source, at least one drain and at least one channel; and
   at least one first gate structure formed on said first ion-implanted layer;
   a plurality of bit-line selection switches coupled to said metal oxide semiconductor devices;
   a plurality of bit lines, wherein each said bit line is coupled to said metal oxide semiconductor devices via a plurality of bit-line contact windows on different said device layers and said bit-line selection switches on different said device layers; and a plurality of word lines interconnecting said gate structures of said metal oxide semiconductor devices and implementing turning on/off of said metal oxide semiconductor devices, wherein data are transferred to specified said metal oxide semiconductor devices via said bit lines;

said metal oxide semiconductor devices are further coupled to a source line, and said source line perpendicularly crosses said bit lines;

each of said source line is coupled to said metal oxide semiconductor devices via a plurality of source-line contact windows on different said device layers and said source-line selection switches on different said device layers; and said bit lines are further coupled to a plurality of bit-line contact windows to integrate corresponding said metal oxide semiconductor devices into a 3-dimensional array structure.

2. A metal oxide semiconductor device array structure according to claim 1, wherein if said device layer is made of a first type semiconductor material, said first ion-implanted layer is implanted with a second type ion; if said device layer is made of a second type semiconductor material, said first ion-implanted layer is implanted with a first type ion; if said first type is P type, said second type is N type; if said first type is N type, said second type is P type.

3. A metal oxide semiconductor device array structure according to claim 1, wherein said device layer is an insulating device layer, and said ion-implanted layer is implanted with a first type ion or a second type ion; if said first type is P type, said second type is N type; if said first type is N type, said second type is P type.

4. A metal oxide semiconductor device array structure according to claim 1, wherein said device layer is a composite device layer, and said ion-implanted layer is implanted with a first type ion or a second type ion; if said first type is P type, said second type is N type; if said first type is N type, said second type is P type.

5. A metal oxide semiconductor device array structure according to claim 4, wherein said composite device layer is a double-well device layer or an oxide device layer.

6. A metal oxide semiconductor device array structure according to claim 1, wherein said first gate structure is a floating gate structure or a charge-trapping gate structure.

7. A metal oxide semiconductor device array structure according to claim 1, wherein said first gate structure is a polysilicon gate structure or a metal gate structure.

8. A metal oxide semiconductor device array structure according to claim 1, wherein said first dielectric layer has a structure of first insulating layer/first storage layer/second insulating layer.

9. A metal oxide semiconductor device array structure according to claim 8, wherein said first insulating layer and said second insulating layer are made of oxides.

10. A metal oxide semiconductor device array structure according to claim 8, wherein said first storage layer is made of nitrides.

11. A metal oxide semiconductor device array structure according to claim 1 further comprising:

a second ion-implanted layer formed on said second surface of said device layer and providing at least one source, at least one drain and at least one channel; and at least one second gate structure formed on said second ion-implanted layer.

12. A metal oxide semiconductor device array structure according to claim 11, wherein said second gate structure further comprises a second dielectric layer and a second gate layer.

13. A metal oxide semiconductor device array structure according to claim 12, wherein said second dielectric layer has a structure of third insulating layer/second storage layer/fourth insulating layer.

14. A metal oxide semiconductor device array structure according to claim 13, wherein said third insulating layer and said fourth insulating layer are made of oxides.

15. A metal oxide semiconductor device array structure according to claim 13, wherein said second storage layer is made of nitrides.

16. A metal oxide semiconductor device array structure according to claim 11, wherein said second gate structure is a floating gate structure or a charge-trapping gate structure.

17. A metal oxide semiconductor device array structure according to claim 11, wherein said second gate structure is a polysilicon gate structure or a metal gate structure.

18. A metal oxide semiconductor device array structure according to claim 1, wherein said bit lines are metallic lines.

19. A metal oxide semiconductor device array structure according to claim 1, wherein said bit-line selection switches are transistors.

20. A metal oxide semiconductor device array structure according to claim 1, wherein said source-line selection switches are transistors.

21. A method for operating a metal oxide semiconductor device array structure, wherein said metal oxide semiconductor device array structure comprises a plurality of metal oxide semiconductor devices, a plurality of bit-line selection switches, a plurality of bit lines, a plurality of word lines, a plurality of source-line selection switches and a plurality of source lines; each said metal oxide semiconductor device comprises a device layer having at least two surfaces, at least one ion-implanted layer formed on said surfaces of said device layer and providing at least one source, at least one drain region and at least one channel region, and at least one gate structure formed on said ion-implanted layer; each said bit line is coupled to corresponding said metal oxide semiconductor devices via one corresponding bit-line selection switch, and said bit line is coupled to said bit-line selection switch via a bit-line contact window; said word lines are formed via interconnecting said gate structure; said source line is coupled to said source-line selection switch, and said source-line selection switches are coupled to said metal oxide semiconductor devices, and wherein said method for operating a metal oxide semiconductor device array structure comprises following steps:

(a) turning on said bit-line selection switch, which is coupled to said bit line and said metal oxide semiconductor devices, and turning on said source-line selection switch of said source line;

(b) selecting at least one said metal oxide semiconductor device via said word line, said source line and said bit line;

(c) respectively applying bias voltages to said metal oxide semiconductor device via said bit line, said source line and said word line; and (d) receiving said bias voltages and changing charge storage state of a corresponding storage layer inside said metal oxide semiconductor device.

22. A method for operating a metal oxide semiconductor device array structure according to claim 21, wherein when said metal oxide semiconductor device is programmed, charge is injected into or removed from said storage layer via said bias voltages, and said metal oxide semiconductor device's bit shifts from 1 to 0.

23. A method for operating a metal oxide semiconductor device array structure according to claim 21, wherein when said metal oxide semiconductor device is programmed, and when said device layer of said metal oxide semiconductor device is a P-type silicon device layer or a P-type semiconductor device layer, methods for applying said bias voltages include an FN (Fowler Nordheim) tunneling method from said gate structure or said channel region, an SHH (Substrate Hot Hole) injection method and a BTBHE (Band-To-Band Hot Electron) injection method.

24. A method for operating a metal oxide semiconductor device array structure according to claim 21, wherein when said metal oxide semiconductor device is programmed, and when said device layer of said metal oxide semiconductor device is a N-type silicon device layer or a N-type semiconductor device layer, methods for applying said bias voltages include an FN (Fowler Nordheim) tunneling method from said gate structure or said channel region, an SHE (Substrate Hot Electron) injection method, and a BTBHH (Band-To-Band Hot Hole) injection method.

25. A method for operating a metal oxide semiconductor device array structure according to claim 21, wherein when said metal oxide semiconductor device is programmed, and when said device layer of said metal oxide semiconductor device is made of an insulating material, an FN (Fowler Nordheim) tunneling method from said gate structure or said channel region is used to apply said bias voltages.

26. A method for operating a metal oxide semiconductor device array structure according to claim 21, wherein when said metal oxide semiconductor device is programmed, and when said device layer of said metal oxide semiconductor device is made of a composite material, methods for applying said bias voltages include an FN (Fowler Nordheim) tunneling method from said gate structure or said channel region, an SHH (Substrate Hot Hole) injection method, an SHE (Substrate Hot Electron) injection method, a BTBHE (Band-To-Band Hot Electron) injection method, and a BTBHH (Band-To-Band Hot Hole) injection method.

27. A method for operating a metal oxide semiconductor device array structure according to claim 21, wherein when said metal oxide semiconductor device undertakes an erasing activity, charge is injected into or removed from said storage layer via said bias voltages, and said metal oxide semiconductor device's bit shifts from 0 to 1.

28. A method for operating a metal oxide semiconductor device array structure according to claim 21, wherein when said metal oxide semiconductor device undertakes an erasing activity, and when said device layer of said metal oxide semiconductor device is a P-type silicon device layer or a P-type semiconductor device layer, methods for applying said bias voltages include an FN (Fowler Nordheim) tunneling method from said gate structure or said channel region, an SHH (Substrate Hot Hole) injection method and a BTBHE (Band-To-Band Hot Electron) injection method.

29. A method for operating a metal oxide semiconductor device array structure according to claim 21, wherein when said metal oxide semiconductor device undertakes an erasing activity, and when said device layer of said metal oxide semiconductor device is a N-type silicon device layer or a N-type semiconductor device layer, methods for applying said bias voltages include an FN (Fowler Nordheim) tunneling method from said gate structure or said channel region, an SHE (Substrate Hot Electron) injection method, and a BTBHH (Band-To-Band Hot Hole) injection method.

30. A method for operating a metal oxide semiconductor device array structure according to claim 21, wherein when said metal oxide semiconductor device undertakes an erasing activity, and when said device layer of said metal oxide semiconductor device is made of an insulating material, an FN (Fowler Nordheim) tunneling method from said gate structure or said channel region is used to apply said bias voltages.

31. A method for operating a metal oxide semiconductor device array structure according to claim 21, wherein when said metal oxide semiconductor device undertakes an erasing activity, and when said device layer of said metal oxide semiconductor device is made of a composite material, methods for applying said bias voltages include an FN (Fowler Nordheim) tunneling method from said gate structure or said channel region, an SHH (Substrate Hot Hole) injection method, an SHE (Substrate Hot Electron) injection method, a BTBHE (Band-To-Band Hot Electron) injection method, and a BTBHH (Band-To-Band Hot Hole) injection method.

32. A method for operating a metal oxide semiconductor device array structure according to claim 21 further comprising a step of checking if said storage layer of said metal oxide semiconductor device is charged correctly after said Step (b).

33. A method for operating a metal oxide semiconductor device array structure according to claim 32, wherein if said storage layer of said metal oxide semiconductor device is charged correctly, said Step (c) is undertaken; if said storage layer of said metal oxide semiconductor device is not charged correctly, said Step (b) is repeated.

34. A metal oxide semiconductor device structure according to claim 1, wherein said first gate structure further comprises a first dielectric layer and a first gate layer.

* * * * *